United States Patent
Lai et al.

(10) Patent No.: US 6,193,854 B1
(45) Date of Patent: *Feb. 27, 2001

(54) APPARATUS AND METHOD FOR CONTROLLING EROSION PROFILE IN HOLLOW CATHODE MAGNETRON SPUTTER SOURCE

(75) Inventors: Kwok Fai Lai, Palo Alto; Larry Dowd Hartsough, Berkeley; Andrew L. Nordquist; Kaihan Abidi Ashtiani, both of Mountain View; Karl B. Levy, Los Altos; Maximilian A. Biberger, Palo Alto, all of CA (US)

(73) Assignee: Novellus Systems, Inc., San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/375,667

(22) Filed: Aug. 16, 1999

Related U.S. Application Data (60) Provisional application No. 60/114,888, filed on Jan. 5, 1999.

(51) Int. Cl.[7] .............................. C23C 14/35; C23C 14/36
(52) U.S. Cl. ........................ 204/192.12; 204/298.12; 204/298.16; 204/298.17; 204/298.18; 204/298.21; 204/298.22; 204/192.15
(58) Field of Search ..................... 204/298.12, 298.16, 204/298.17, 298.18, 298.21, 298.22, 192.12, 192.15

(56) References Cited

U.S. PATENT DOCUMENTS

| | | | | |
|---|---|---|---|---|
| 4,622,121 | * | 11/1986 | Wegmann et al. | 204/298.18 |
| 5,194,131 | * | 3/1993 | Anderson | 204/192.12 |
| 5,482,611 | * | 1/1996 | Helmer et al. | 204/298.17 |
| 6,024,843 | * | 2/2000 | Anderson et al. | 204/192.12 |

FOREIGN PATENT DOCUMENTS 61-190070 * 8/1986 (JP).
3-285067 * 12/1991 (JP).

* cited by examiner

*Primary Examiner*—Alan Diamond
(74) *Attorney, Agent, or Firm*—Skjerven Morrill MacPherson LLP; David E. Steuber (57) ABSTRACT

A hollow cathode magnetron (HCM) sputter source includes a main magnet positioned near the sidewall of the hollow cathode target and a pair of rotating magnet arrays that are positioned near the closed end of the hollow cathode target. One of the arrays produces a magnetic field that is aligned with (aids) the magnetic field produced by the main magnet; the other arrays produce a magnetic field that is aligned against (bucks) the magnetic field produced by the main magnet. Field lines produced by the magnet arrays contain an extension of the plasma that is controlled by the main magnet. Charged particles circulate between the two portions of the plasma. The extended plasma is thus formed over a very high percentage of the surface of the target, thereby creating an erosion profile that is highly uniform and encompasses essentially the entire face of the target. This maximizes the utilization of the target and minimizes the frequency at which the spent target must be replaced.

34 Claims, 12 Drawing Sheets

APPARATUS AND METHOD FOR CONTROLLING EROSION PROFILE IN HOLLOW CATHODE MAGNETRON SPUTTER SOURCE

CROSS REFERENCE TO RELATED APPLICATIONS

This application claims the priority of provisional Application No. 60/114,888, filed Jan. 5, 1999. This application is related to U.S. Pat. No. 5,482,611 to Helmer et al., issued Jan. 9, 1996, entitled "Physical Vapor Deposition Employing Ion Extraction From A Plasma," assigned to Novellus Systems, Inc., and application Ser. No. 09/073,358 to Lai, filed May 6, 1998, pending entitled "Apparatus and Method For Improving Target Erosion In Hollow Cathode Magnetron Sputter Source," assigned to Novellus Systems, Inc., each of which is incorporated herein by reference in its entirety.

FIELD OF THE INVENTION

This invention relates to magnetron sputter sources containing a hollow cathode target and in particular to an apparatus and method for improving the erosion profile of the target in such devices.

BACKGROUND OF THE INVENTION

The teachings of the above-referenced U.S. Pat. No. 5,482,611 to Helmer et al. have been found to be very useful in providing a physical vapor deposition source (frequently referred to as a "sputtering" source) which exhibits an improved directionality and degree of ionization of the target metal vapor while achieving a commercially acceptable deposition rate. The Helmer patent essentially teaches a magnetron sputter source containing a hollow cathode target (HCT).

Figure 1:
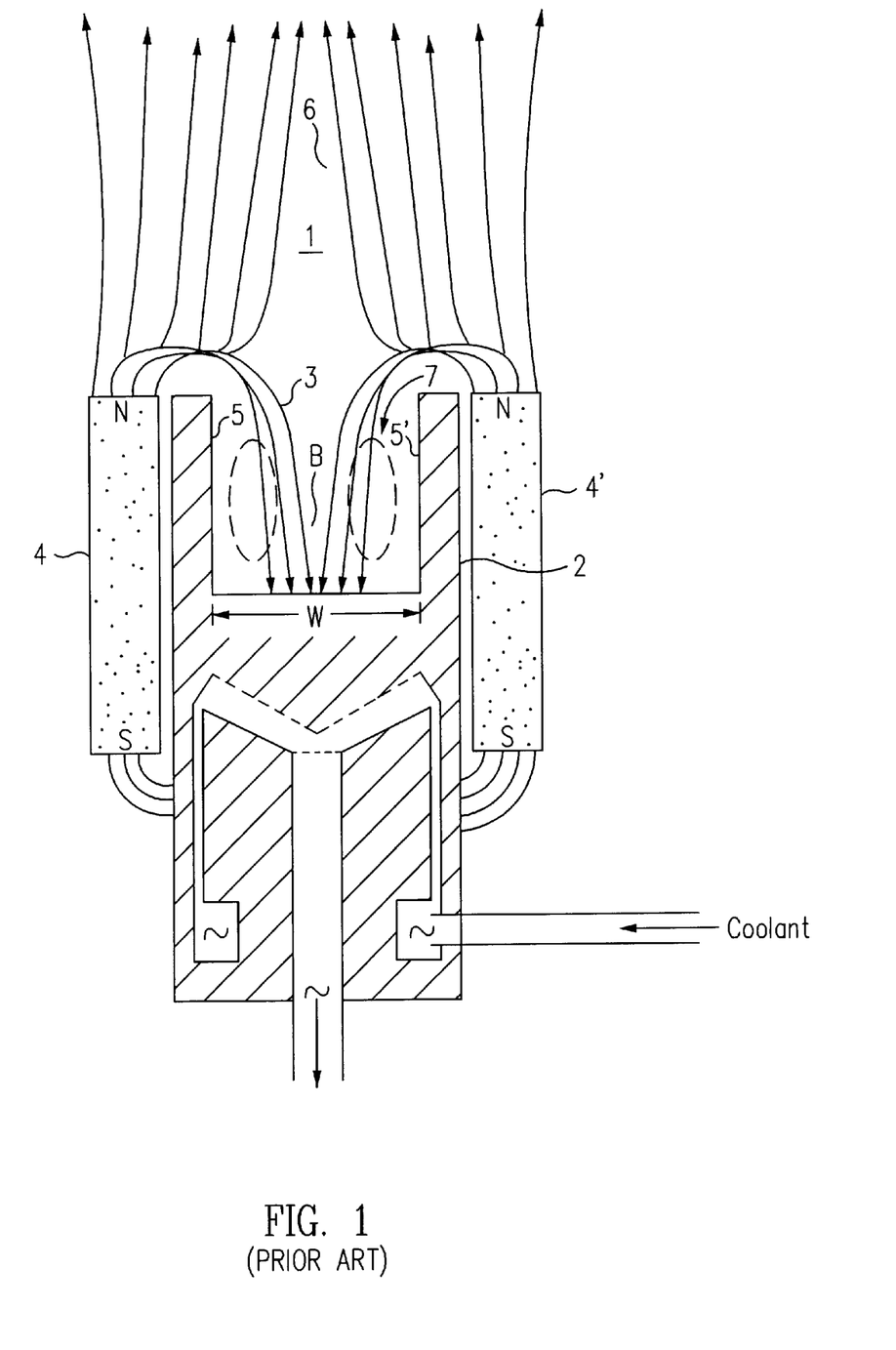
FIG. 1 is a cross-sectional view of a hollow cathode magnetron (HCM) sputter source.

This structure is generally illustrated in FIG. 1, which shows a magnetron sputter source containing a "hollow" target 2. The cup-shaped cavity in target 2 is surrounded by walls 5–5'. The permanent magnet 4–4' provides magnetic field lines which are generally parallel to the surfaces of walls 5–5' inside the cavity and which form a magnetic null in the region designated 1 at the opening of the cavity.

In operation, the pressure in the reaction chamber is reduced to, for example $10^{-5}$ torr or less. A small quantity of an inert gas such as argon is introduced into the reaction chamber, increasing the pressure to the range of 1–5 millitorr, for example. When a plasma discharge is created, in a known manner, by applying a high negative voltage to the target 2, this arrangement produces a doughnut-shaped plasma 7 (shown by the dashed lines) along the walls 5–5'.

The width W and depth of the target cavity are on the same order dimensionally. This provides a high probability that the neutral target atoms sputtered from the walls 5–5' will be either ionized by the highly intense plasma or redeposited on the opposite wall and then resputtered back towards the wall from which they originated. For example, it has been computed that 54.8% of the sputtered atoms are ionized, as compared with 2% of the atoms in prior art magnetron sputter sources. (The ionization percentage is sometimes referred to as the "plasma intensity".) The magnetic null region 1 at the upper edge 6 of the region 3 traps and retains ions and electrons inside the cavity except for those particles which enter the null region 1 with an axial velocity and very little radial velocity. Thus, ions and electrons which have primarily an axial velocity are able to leave the cavity along the axis at the upper edge of the region 3. Other particles are "reflected" back into and contained within the cavity.

Several advantages derive from using the magnetic "mirror" to extract the plasma. Once the electrons leave the discharge region, the null mirror isolates the electrons in the plasma and prevents the beam from coupling with the electrons inside the cavity. Therefore, the exiting plasma beam can be manipulated or biased without affecting the discharge characteristics in the cathode. By isolating the extracted plasma from the discharge, the confining null-field magnetron cathode is far more flexible than most other plasma sources. Another advantage is that the transverse velocity of the plasma beam is very small. This allows the plasma beam to be steered, focused or expanded using small magnetic or electric fields.

One problem that can occur, however, is that the erosion of the HCM target is non-uniform. In particular, the center of the closed end and corners of the target may show a net deposition. It has been determined that this is due to the shape of the magnetic field lines in these areas.

The above-referenced application Ser. No. 09/073,358 teaches that the erosion profile of an HCM target can be controlled using pole plates, tapered sidewall magnetic fields, a rotating magnet array placed adjacent the closed end of the HCM target, or a combination thereof. The rotating magnet array, in particular, can enhance the erosion of the closed end of the target and opens the possibility of achieving full-face erosion of the entire HCM target. However, problems may be created by the interaction of the main magnetic field with the magnetic field produced by the rotating magnet array. This is predominantly due to the fact that the rotating magnet array tends to support a separate plasma discharge on the target surface adjacent to it which in turn competes with the main HCM plasma discharge.

In a configuration where the magnetic field produced by the rotating magnet array is aligned with, or "aids", the main magnetic field, erosion is increased at the outer diameter of the closed end but reduced near the center of the closed end. Where the magnetic field produced by the rotating magnet array is aligned against, or "bucks", the main magnetic field, erosion is reduced at the outer diameter of the closed end but increased near the center of the closed end.

Ideally, the erosion profile should be uniform to permit maximum utilization of the target and to minimize the number of times that the spent target must be replaced. It is also important to achieve a uniform erosion of the entire target to prevent flaking of back-scattered deposits of the target material. Such flakes can contaminate the substrate that is being processed.

Thus there is a need for even more effective techniques of controlling the target erosion profile in an HCM sputter source.

SUMMARY OF THE INVENTION

A hollow cathode magnetron sputter source according to this invention comprises a cathode target having a sidewall portion and a closed end portion, the sidewall and closed end portions of the target forming a cavity; a main magnet positioned adjacent the sidewall portion of the target outside of the cavity, the main magnet producing a main magnetic field having field lines that extend into the cavity; and first and second magnet arrays positioned adjacent the closed end of the target outside of the cavity and rotatable about an axis, the first magnet array being oriented to produce a magnetic field which is aligned with (aids) the main magnetic field, the second magnet array being oriented to produce a magnetic field which aligned against (bucks) the main magnetic field. The first and second magnet arrays can be affixed to a rotatable magnet plate which can be made of a magnetic material such as iron. The first and second magnet arrays can be arranged in a variety of patterns, such as arcs and radial lines.

This invention also includes a method of operating a hollow cathode magnetron sputter source of the above description, the method comprising reducing the pressure in the sputter source; introducing an inert gas into the sputter source; applying a negative voltage to the target so as to create a plasma in the cavity; and rotating the magnet arrays. In some embodiments the target is symmetrical about an axis and the magnet arrays are rotated about the axis.

As the magnet arrays rotate, the aiding magnet array draws the plasma from the main discharge to the closed end portion of the target. The plasma is circulated around the outer periphery of the aiding magnet array until the plasma meets the leading edge of the bucking magnet array. The magnet arrays in effect form a magnetic "tunnel" in the central region of magnet plate, and this magnetic tunnel circulates the plasma into the central region of the closed end portion of the target. Depending on the geometry of the magnet arrays, the plasma can be expanded to fill the area between the arrays to achieve the desired erosion profile. The circulated plasma leaks out of the area between the tunnels and returns to the main discharge via the opposite opening of the aiding array and the bucking array.

Thus, instead of creating a plasma that is separated from the plasma that is associated with the main magnet, the rotating magnet arrays produce a plasma that is effectively an extension of the main plasma. Charged particles circulate between the interconnected plasmas. The geometry of the magnet arrays can be adjusted such that sputtering occurs over essentially the entire closed end portion of the target.

BRIEF DESCRIPTION OF THE DRAWINGS

This invention will be better understood by referring to the following drawings, in which like elements have the same reference numerals:

FIGS. 5–8 illustrate some configurations of the magnet arrays.

DESCRIPTION OF THE INVENTION

Figure 2:
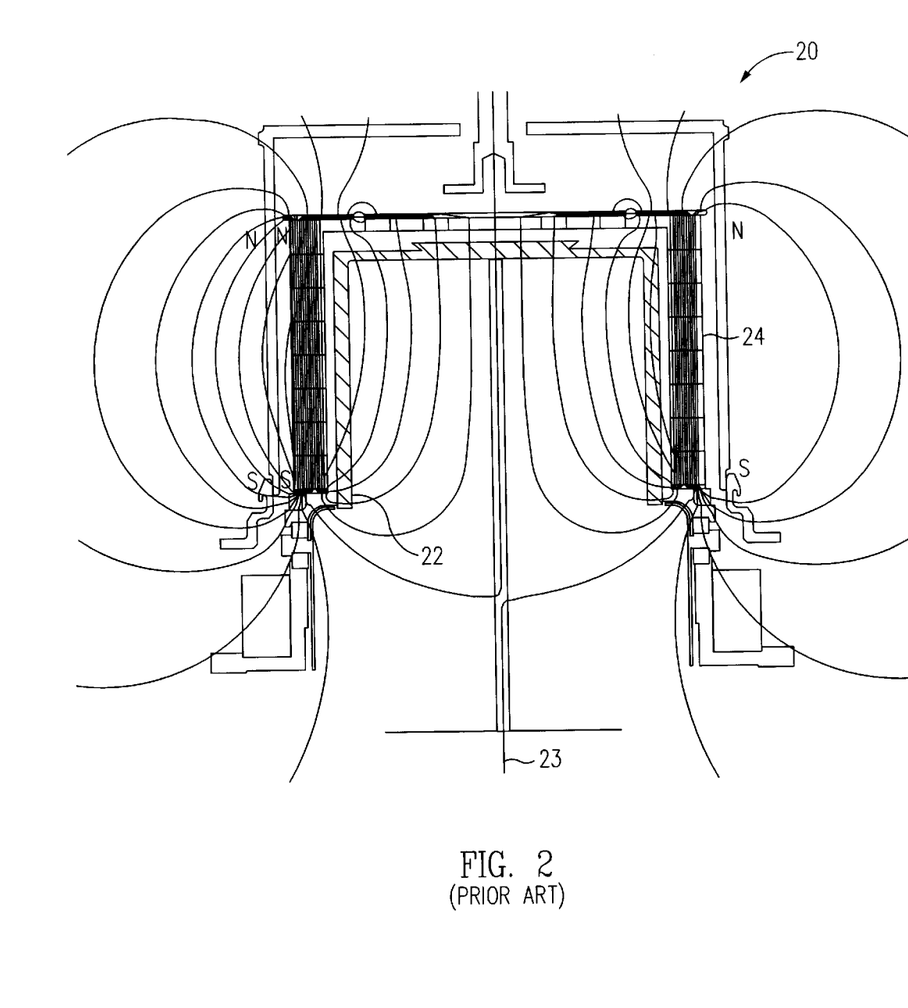
FIG. 2 is a cross-sectional view of an HCM sputter source showing the field lines produced by the main magnets.

The pattern of magnetic lines of force in a hollow cathode magnetron (HCM) sputter source 20 is shown in FIG. 2. HCM sputter source 20 includes a target 22 and a magnet 24 which surrounds the walls of target 22. The north pole of magnet 24 is adjacent the flat closed end of target 22; the south pole of magnet 24 is adjacent the open end of target 22. As shown, the lines of force are symmetrical about the axis 23 of target 22 and inside the cavity are generally parallel to the walls of target 22.

Figure 3:
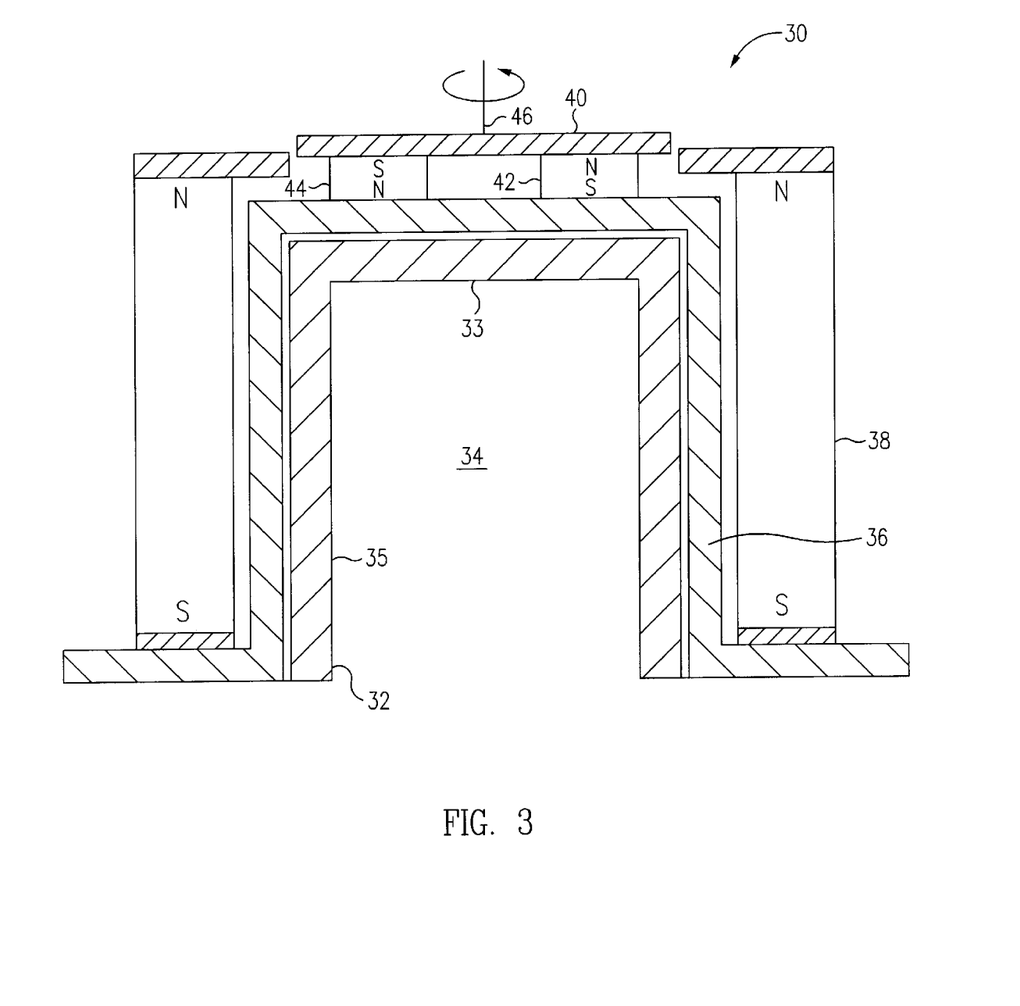
FIG. 3 is a cross-sectional view of an HCM sputter source containing a rotating magnet array in accordance with this invention.

FIG. 3 is a cross-sectional view of an HCM sputter source 30 in accordance with this invention, including a cup-shaped target 32 which forms a cavity 34. Target 32 has a closed end 33 and a sidewall 35. Surrounding target 32 is a target housing 36 and a main magnet 38. The north pole of magnet 38 is adjacent the closed end of target 32; the south pole of magnet 38 is adjacent the open end of target 32.

Positioned above the closed end 33 of target 32 is a rotatable magnet plate 40 to which are affixed magnet arrays 42 and 44. As described below, each of magnet arrays 42 and 44 may contain a plurality of individual magnets which may be configured in various patterns on the surface of magnet plate 40. Magnet arrays 42 and 44 are generally located on opposite sides of the axis of rotation 46 of magnet plate 40, and the polarity of magnet arrays 42 and 44 is opposite, i.e., the north pole of magnet array 44 is directed towards target 32; the north pole of magnet array 42 is directed away from target 32. Magnet plate 40 may be made of a magnetic material such as iron or a non-magnetic material such as aluminum or stainless steel. The magnetic material is preferred. In some embodiments a single bar magnet may be used for each magnet array.

Figure 4:
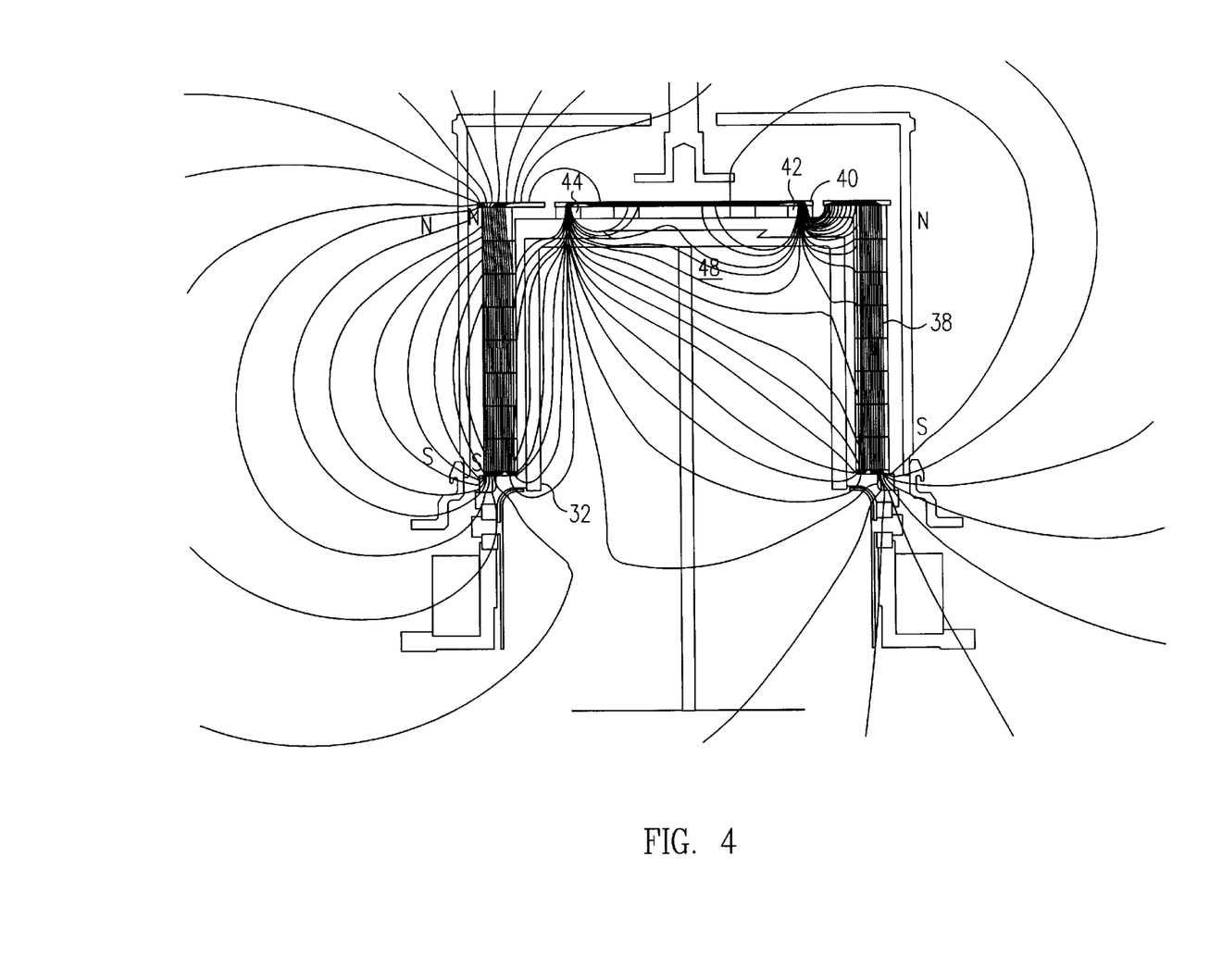
FIG. 4 is a cross-sectional view of an HCM sputter source of this invention showing the field lines produced by the combination of the main magnets and the rotating magnet array.

From an examination of FIG. 3 it will be apparent that magnet array 44 is aligned with (or "aids") the magnetic field generated by the main magnet 38 and magnet array 42 is aligned in opposition to (or "bucks") the magnetic field generated by the main magnet 38. This is shown in FIG. 4. Accordingly, magnet array 44 is sometimes referred to as the "aiding array" and magnet array 42 is sometimes referred to as the "bucking array".

As noted above, magnet arrays 42 and 44 can be formed in various configurations. FIGS. 5–8 illustrate some of these configurations. Each of these views is of magnet plate 40 taken from the direction of target 38.

Figure 5:
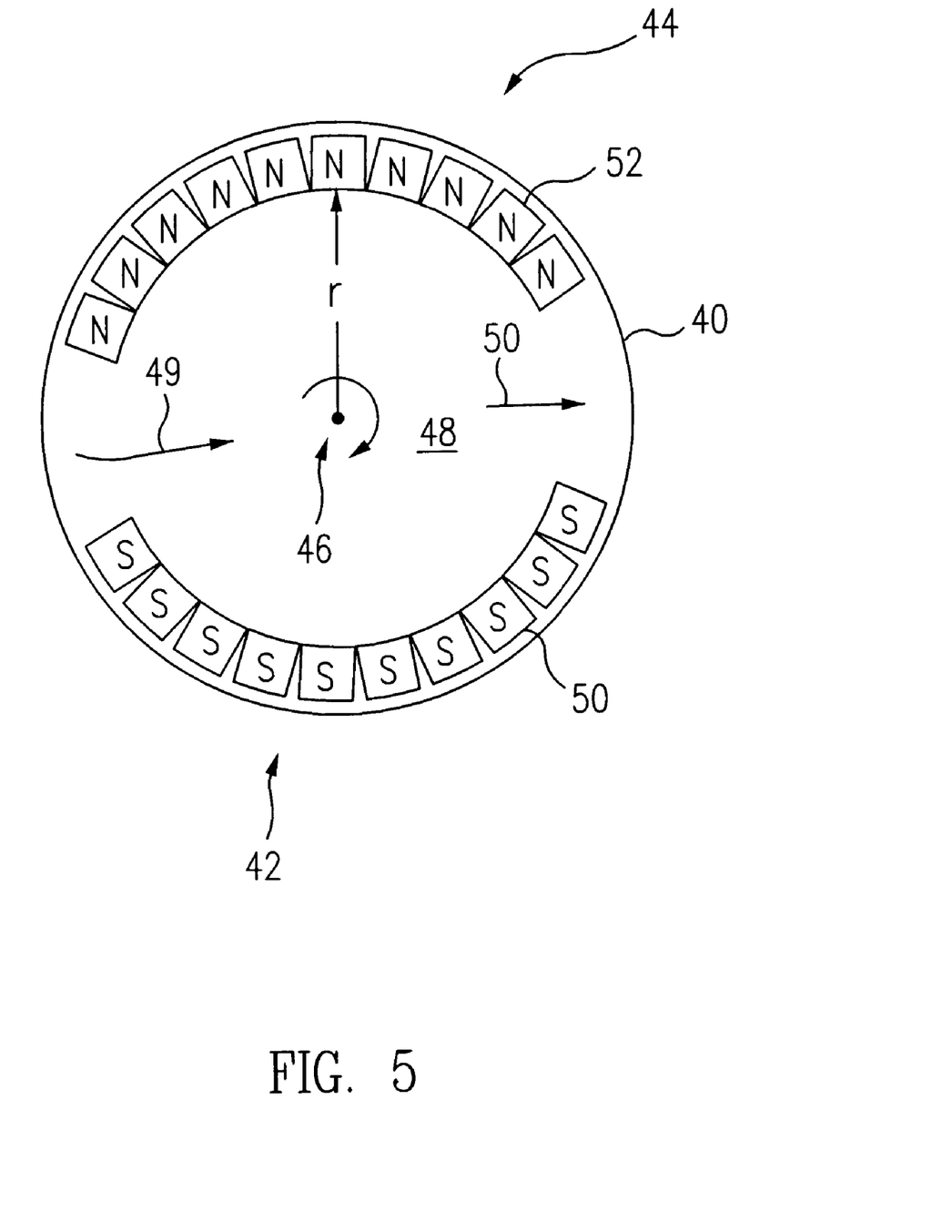
FIG. 5 shows magnet arrays in the shape of semicircular arcs having the same radius of curvature.

In FIG. 5 magnet array 42 includes a plurality (10) of magnets 50 formed in an arc and magnet array 44 includes a plurality (10) of magnets 52 formed in an arc. A space is left between the ends of the arcs so the plasma from the target sidewall 35 adjacent the closed end 33 is divided and partially fills the central region of the closed end 33. In some embodiments the arcs may not be equal in length. The erosion profile of the closed end 33 can be precisely controlled by varying the inner radius r of the arcs, the number of magnets aiding and bucking the magnetic field produced by the magnet 38, the strength of magnets 50 and 52, and the distance between the magnets 50 and 52 and the closed end 33 of the target 32. Magnet arrays 42 and 44 can be arranged in patterns other than a circle, and more than two groups of magnets may be used to further "fine tune" the erosion profile.

In the embodiment of FIG. 5 magnet plate 40 is circular and rotates about axis 46 which coincides with the centerpoint of magnet plate 40. In other embodiments the axis of rotation 46 does not coincide with the centerpoint of the magnet plate.

In the embodiment of FIG. 5 and other embodiments of this invention, the aiding magnet array 44 draws the plasma from the main discharge to the closed end 33 of the target 32. The plasma is circulated around the outer periphery of the aiding magnet array 44 until the plasma meets the leading edge of the bucking magnet array 42 (see arrow 49). The direction of rotation of magnet plate 40 is shown by the arrow around centerpoint 46. The magnet arrays 42 and 44 form a magnetic "tunnel" in the cavity adjacent the central region of magnet plate 40, and this magnetic tunnel circulates the plasma into the central region of the closed end 33. The magnetic tunnel is located generally in the region 48 shown in FIGS. 4 and 5. Depending on the geometry of the magnet arrays 42 and 44, the plasma can be expanded to fill the area between the arrays 42 and 44 to achieve the desired erosion profile. The circulated plasma leaks out of the magnetic tunnel and returns to the main discharge via the opening between the aiding array 44 and the bucking array 42 on the opposite side of magnet plate 40 (see arrow 50).

Figure 6:
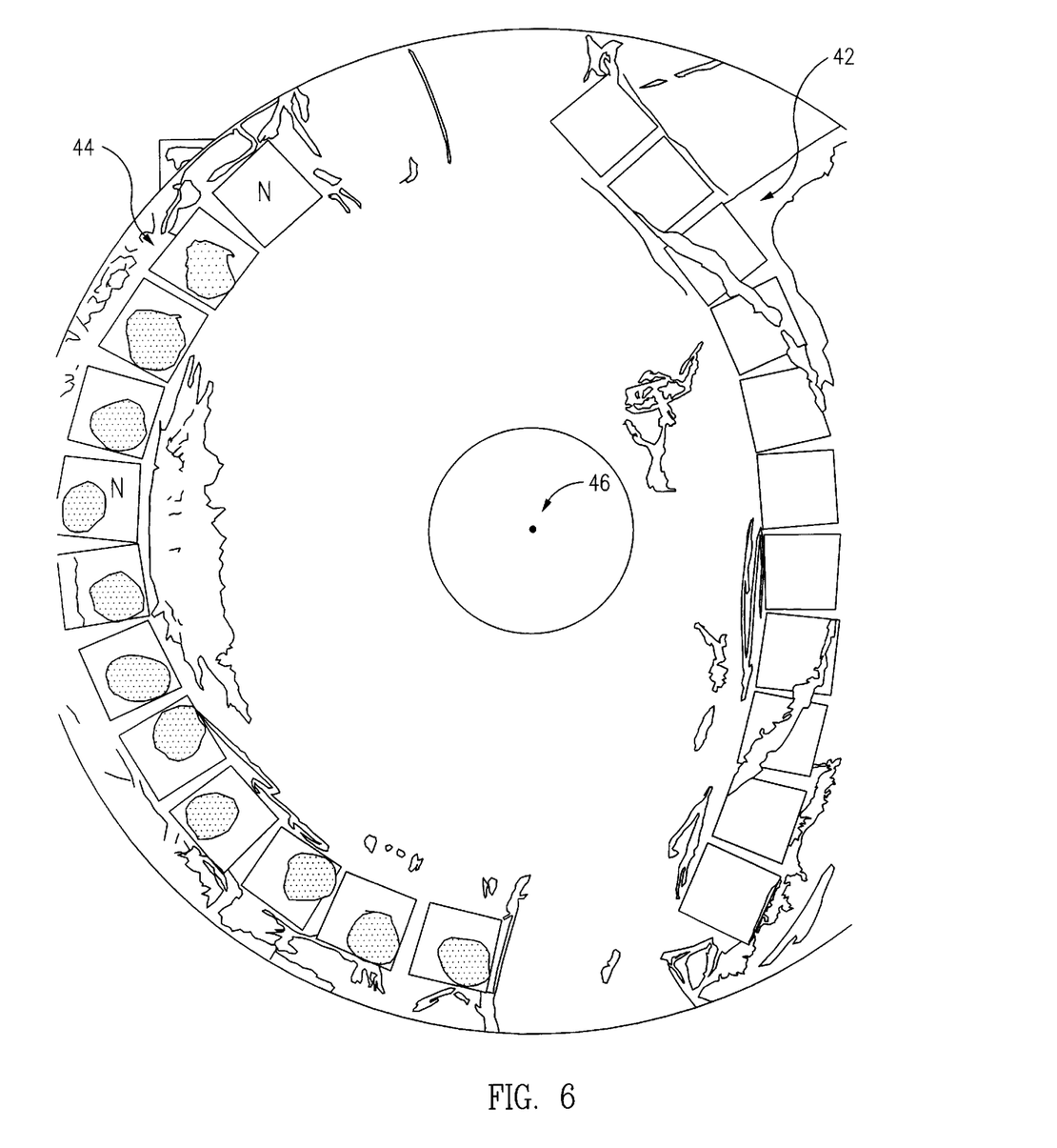
FIG. 6 shows magnet arrays in the shape of semicircular arcs having the different radii of curvature.
Figure 7:
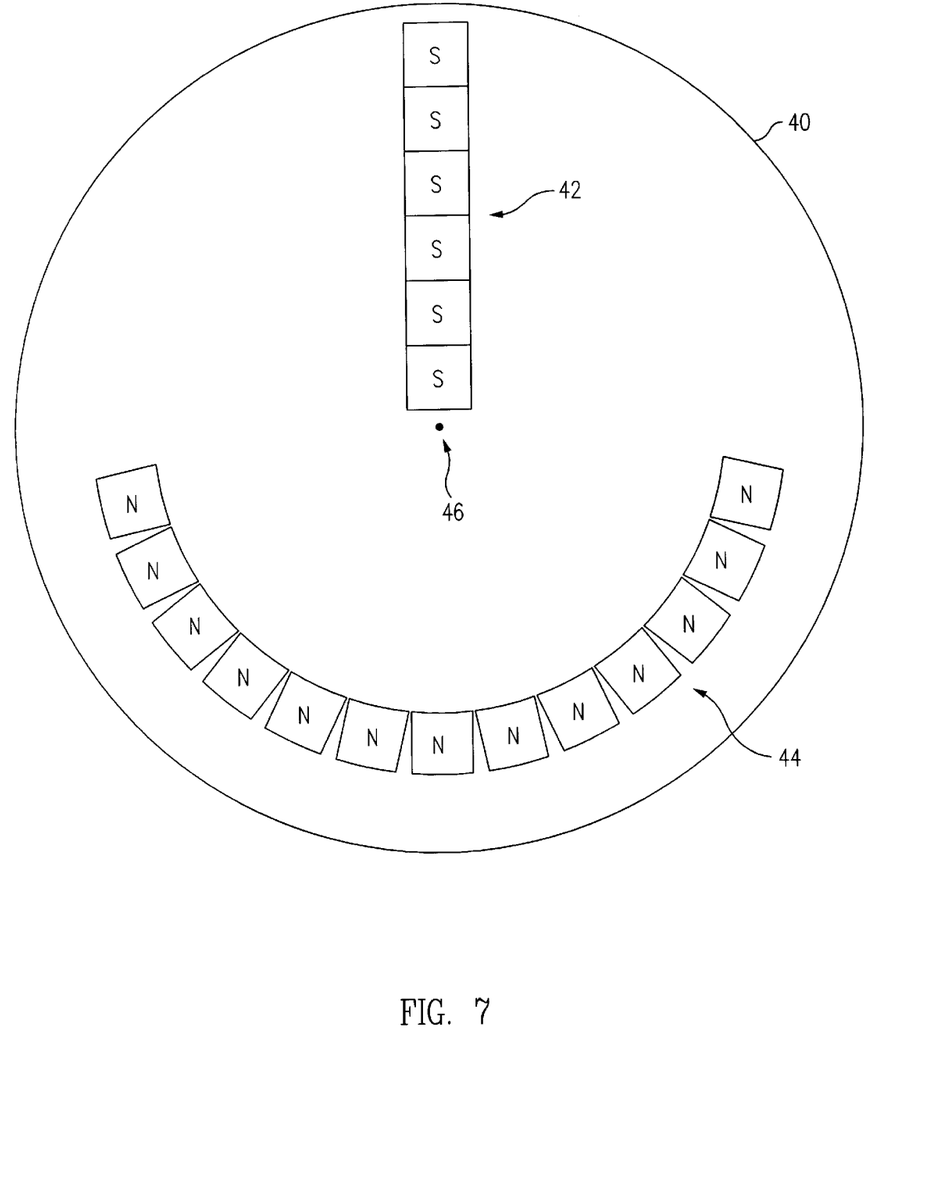
FIG. 7 shows magnet arrays that include one semicircular arc and one radial line of magnets.

By varying the design of the magnet arrays 42 and 44, almost any desired erosion profile can be achieved. In addition to the arcuate arrays shown in FIG. 5, spiral arrays and asymmetrical arrays of various shapes can also be used. In some of the arrays, individual magnets may be positioned in the central region of the magnet plate 40 to attract or deflect the circulated plasma. For example, FIG. 6 shows arcuate magnet arrays 42 and 44 with the arcs having different radii of curvature. FIG. 7 shows an actuate aiding array 44 and a radial bucking array 42.

Figure 8:
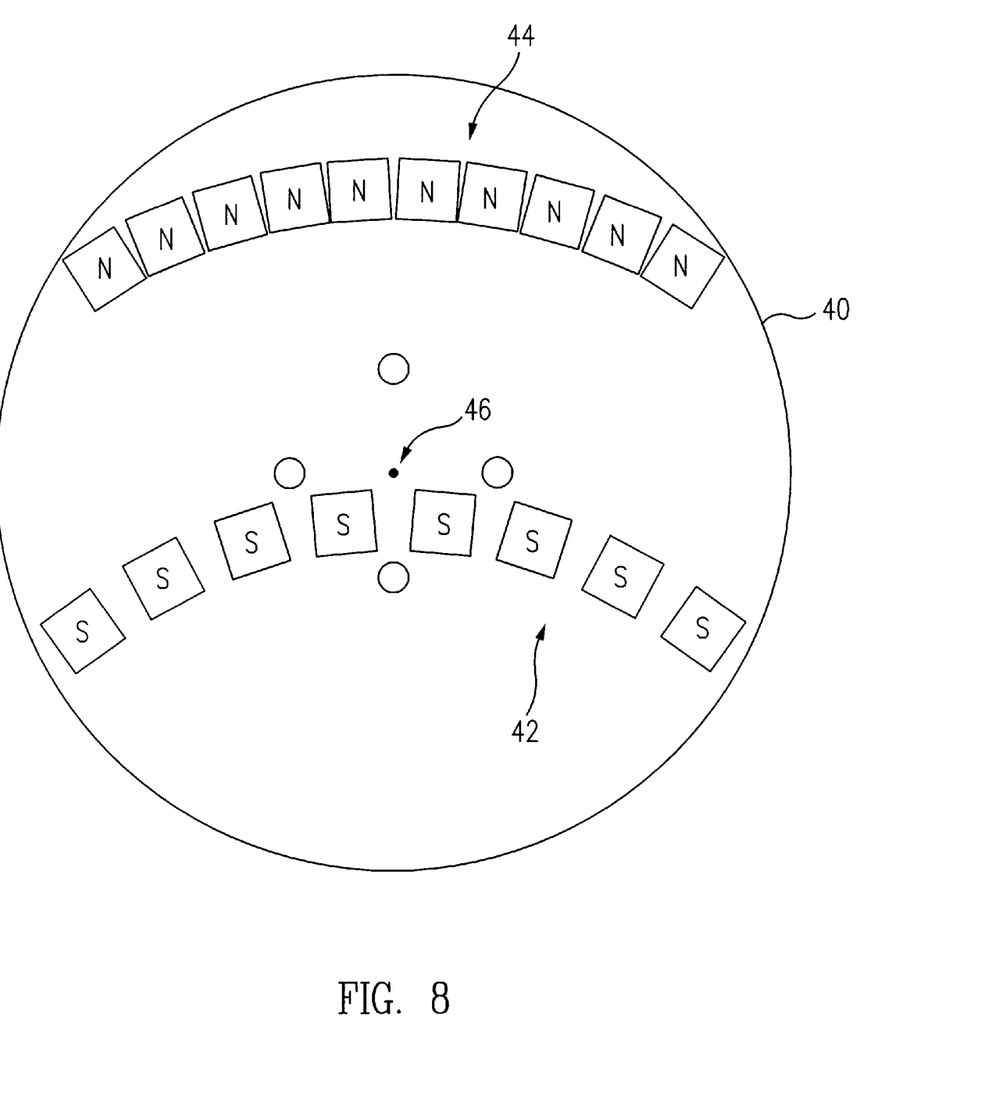
FIG. 8 shows magnet arrays that include one arc with a convex side facing the centerpoint of the magnet plate and a second arc with a concave side facing the centerpoint of the magnet plate.

FIG. 8 shows an embodiment wherein both the bucking array 42 and the aiding array 44 are arcuate, with the concave side of array 44 facing axis 46 and the convex side of bucking array 42 facing axis 46. Many other configurations of arrays 42 and 44 will be apparent to those skilled in the art.

Figure 9A:
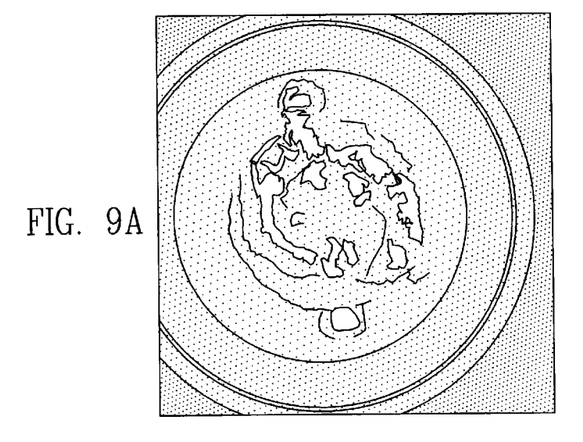
FIG. 9A is a photograph of magnet arrays in the form of spirals.
Figure 9B:
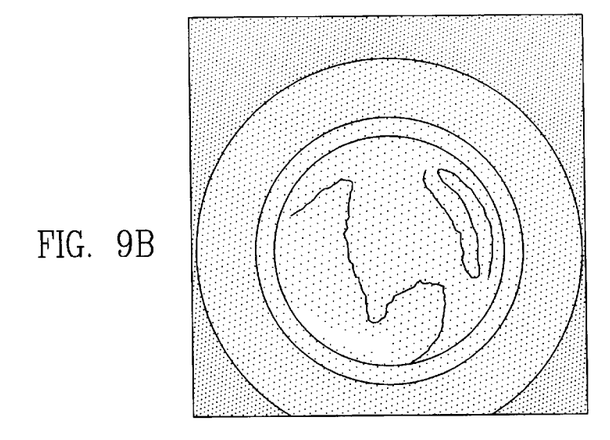
FIG. 9B is a photograph of the plasma produced by the magnet arrays shown in FIG. 9A when the magnet plate is stationary.
Figure 9C:
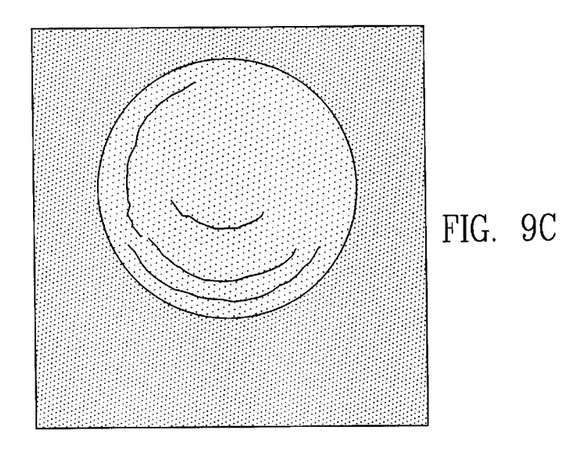
FIG. 9C is a time-averaged photograph of the plasma produced by the magnet arrays shown in FIG. 9A while the magnet plate is rotating.

FIG. 9A is a digital image of an embodiment wherein both of the magnet arrays are spiral, and FIG. 9B is a false color image of the light emission of the plasma when the magnet arrays of FIG. 9A are not rotating. As is apparent, there is an excellent correlation between the arrangement of the magnets and the light intensity of the plasma. FIG. 9C shows a time-averaged view of the light intensity of the plasma produced by the spiral arrays of FIG. 9A when the magnet plate is rotating.

Figure 10:
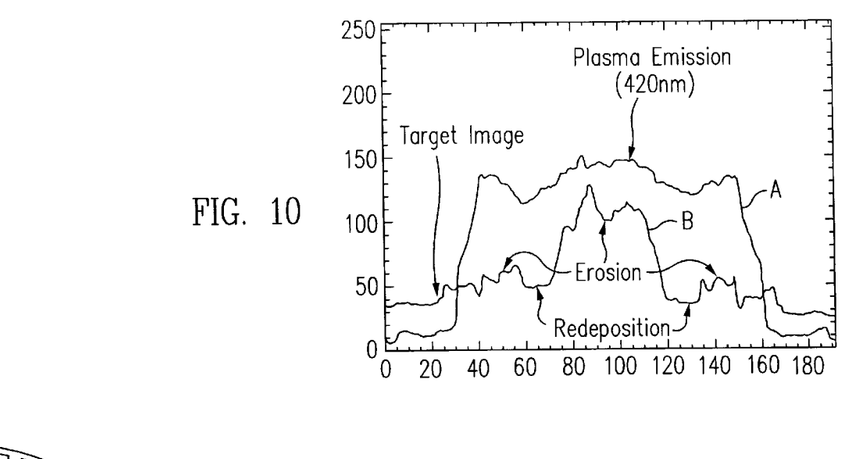
FIG. 10 is a graph showing the correlation between the intensity of the light emitted by the plasma ($\lambda$=420 nm) and the erosion of the target.

The graph shown in FIG. 10 provides further evidence of the correlation between the erosion profile of the target and the intensity of the light emitted by the plasma. The curve labeled A shows the intensity of the light emitted by the plasma at a wavelength of 420 nm. Curve B shows the extent to which the target is eroded. Areas of redeposition are indicated. The light intensity of the plasma provides a useful technique for designing the magnet arrays to achieve a desired erosion profile. By adjusting the magnet arrays to achieve a desired plasma light emission profile before any extended erosion of the target, the time and number of iterations required for the adjustment of the magnet arrays to obtain a desired erosion profile on the closed end of the target can be minimized.

Figure 11A:
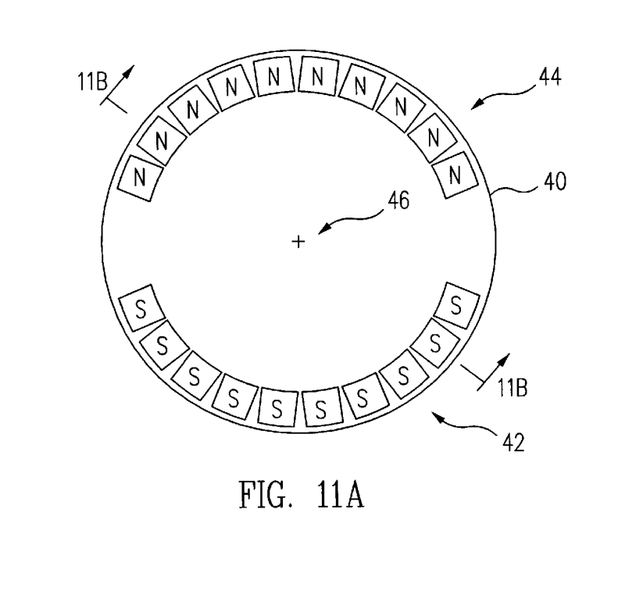
FIGS. 11A and 11B are top and cross-sectional views, respectively, of a magnet array containing stacks of magnets.
Figure 11B:
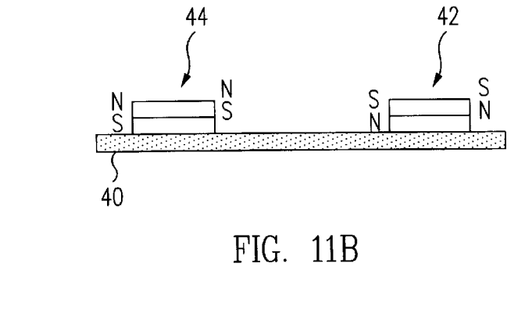

Each of the magnets in the arrays may include a stack of magnets or one or more magnets positioned over a magnetic or non-magnetic pedestal. An example of such an embodiment is shown in FIGS. 11A and 11B. FIG. 11B is taken at cross-section 11B—11B shown in FIG. 11A. Magnet arrays 42 and 44 contain a number of stacked magnets, with the polarity of the magnets in each stack being aligned in the same direction. Alternatively, the lower magnet in each stack could be a magnetic or non-magnetic pedestal on magnet plate 40.

Figure 12:
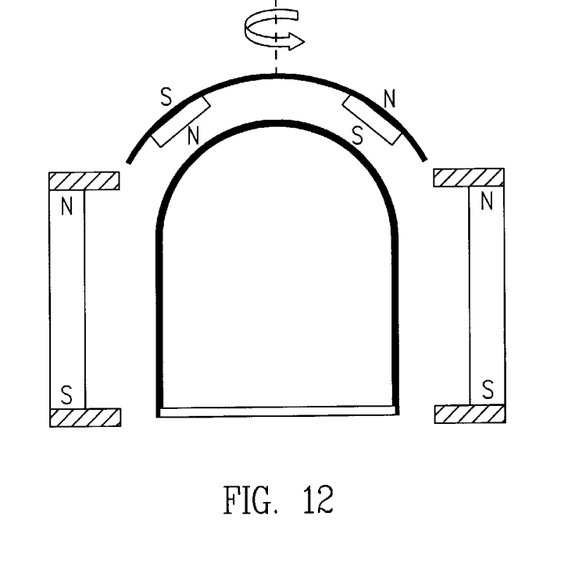
FIG. 12 shows rotating magnet arrays used in conjunction with a dome-shaped target.
Figure 13A:
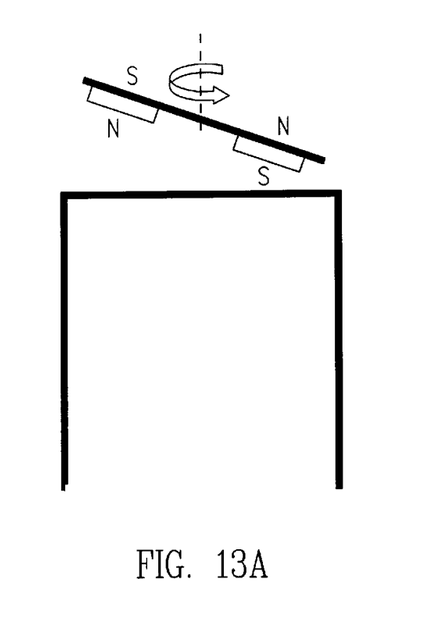
FIGS. 13A and 13B show cross-sectional views of tilted rotating magnet arrays.
Figure 13B:
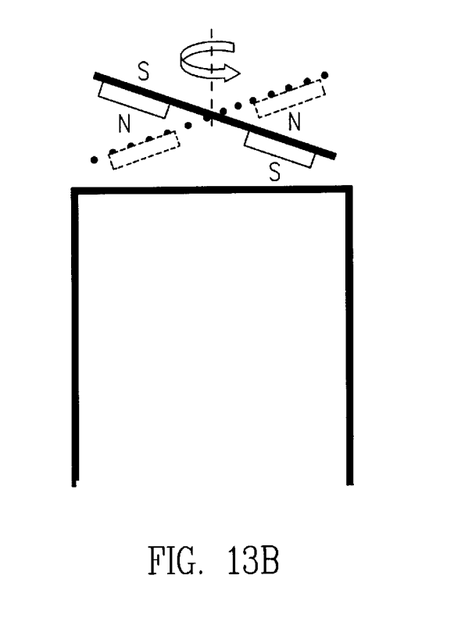
Figure 14:
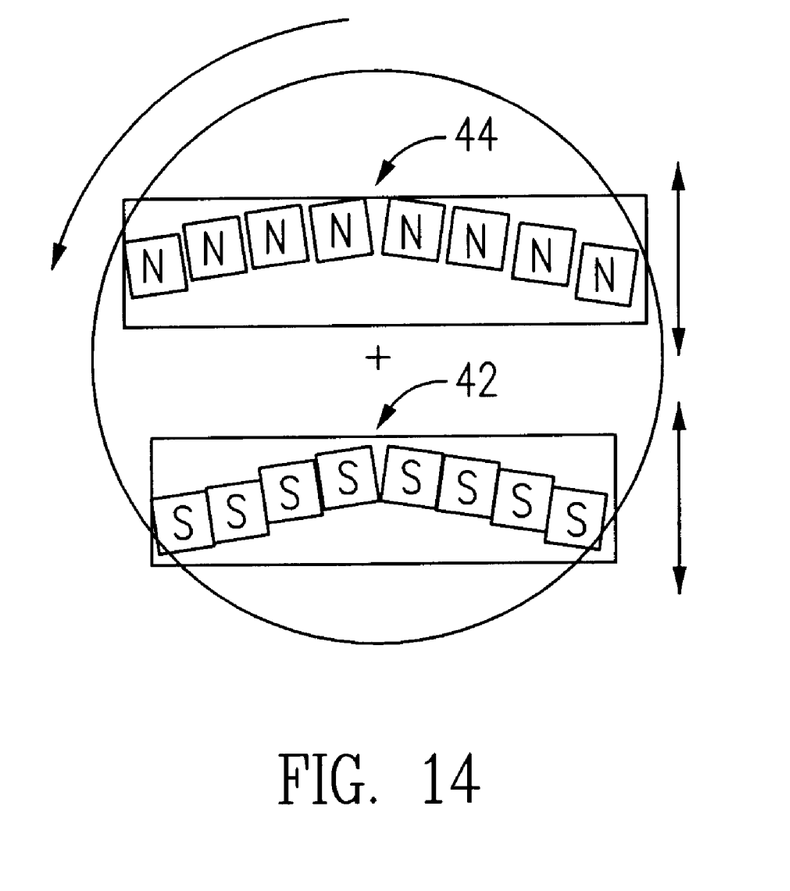
FIG. 14 shows a top view of an embodiment in which the magnet arrays are movable radially with respect to the magnet plate.

The cathode target need not have a flat closed end, as described in the previous embodiments. For example, as shown in FIG. 12, the closed end of the cathode target can be dome-shaped and the magnet plate can also be dome-shaped and parallel to the target. A flat magnet plate of the kind shown in FIG. 3 can be used with a dome-shaped cathode target. Also, as shown in FIGS. 13A and 13B, the rotating magnet plate can be tilted. And, as shown in FIG. 14, the magnet arrays 42 and 44 can be movable radially inward and outward with respect to the center of the magnet plate as the magnet plate rotates. The movable magnet arrays of FIG. 14 can be included in embodiments like those shown in FIGS. 13A and 13B wherein the magnet plate is tilted.

The magnets in the magnet arrays can be permanent magnets or electromagnets. In addition, if the magnets in the arrays are electromagnets, the magnet plate can be stationary, and the magnets can be turned on and off in sequence to create "virtual" rotating magnet arrays, with the direction of the current in the electro magnets determining which magnets are "aiding" and which magnets are "bucking".

While specific embodiments of this invention have been described herein, it is to be understood that these embodiments are illustrative and not limiting. Many additional embodiments that are within the broad principles of this invention will be apparent to persons skilled in the art.

We claim:

1. A hollow cathode magnetron sputter source comprising:
   a cathode target having a sidewall portion and a closed end portion, the sidewall and closed end portions of the target forming a cavity;
   a main magnet positioned adjacent the sidewall portion of the target outside of the cavity, the main magnet producing a main magnetic field having field lines that extend into the cavity; and
   first and second magnet arrays positioned adjacent the closed end of the target outside of the cavity and rotatable about an axis, the first magnet array being oriented to produce a magnetic field which aids the main magnetic field, the second magnet array being oriented to produce a magnetic field which bucks the main magnetic field.

2. The hollow cathode magnetron sputter source of claim 1 wherein the first and second magnet arrays are affixed to a rotatable magnet plate.

3. The hollow cathode magnetron sputter source of claim 2 wherein the first magnet array comprises a substantially uninterrupted row of magnets arranged in the form of a first arc.

4. The hollow cathode magnetron sputter source of claim 3 wherein the second magnet array comprises a substantially uninterrupted row of magnets arranged in the form of a second arc.

5. The hollow cathode magnetron sputter source of claim 4 wherein each of the first and second arcs is semicircular.

6. The hollow cathode magnetron sputter source of claim 4 wherein a radius of curvature of the first arc is the same as a radius of curvature of the second arc.

7. The hollow cathode magnetron sputter source of claim 4 wherein a radius of curvature of the first arc is different from the radius of curvature of the second arc.

8. The hollow cathode magnetron sputter source of claim 4 wherein a concave side of the first arc faces a centerpoint of the magnet plate.

9. The hollow cathode magnetron sputter source of claim 8 wherein a concave side of the second arc faces the centerpoint of the magnet plate.

10. The hollow cathode magnetron sputter source of claim 9 wherein a convex side of the second arc faces the centerpoint of the magnet plate.

11. The hollow cathode magnetron sputter source of claim 3 wherein the second magnet array comprises a plurality of magnets arranged in a radial line.

12. The hollow cathode magnetron sputter source of claim 2 wherein the magnet plate is made of a magnetic material.

13. The hollow cathode magnetron sputter source of claim 12 wherein the magnetic material comprises iron.

14. The hollow cathode magnetron sputter source of claim 2 wherein the magnet plate is made of a non-magnetic material.

15. The hollow cathode magnetron sputter source of claim 2 wherein the closed end portion of the target is flat.

16. The hollow cathode magnetron sputter source of claim 15 wherein the magnet plate is flat and parallel to the closed end portion of the target.

17. The hollow cathode magnetron sputter source of claim 16 wherein at least one of the first and second magnet arrays is movable in a radial direction with respect to the magnet plate.

18. The hollow cathode magnetron sputter source of claim 15 wherein the magnet plate is flat and not parallel to the closed end portion of the target.

19. The hollow cathode magnetron sputter source of claim 18 wherein the first and second magnet arrays are movable in a radial direction with respect to the magnet plate.

20. The hollow cathode magnetron sputter source of claim 2 wherein the magnet plate rotates about an axis which coincides with a centerpoint of the magnet plate.

21. The hollow cathode magnetron sputter source of claim 2 wherein the magnet plate rotates about an axis which is spaced apart from a centerpoint of the magnet plate.

22. The hollow cathode magnetron sputter source of claim 2 wherein the closed end portion of the target is dome-shaped and the magnet plate is also dome-shaped and parallel to the closed end portion of the target.

23. The hollow cathode magnetron sputter source of claim 2 wherein the closed end portion of the target is dome-shaped and the magnet plate is flat.

24. The hollow cathode magnetron sputter source of claim 1 wherein the first and second magnet arrays comprise permanent magnets.

25. The hollow cathode magnetron sputter source of claim 1 wherein the north pole of each of the magnets in the first magnet array faces the closed end portion of the target and the south pole of each of the magnets in the second magnet array faces the closed end portion of the target.

26. The hollow cathode magnetron sputter source of claim 1 wherein at least one of the first and second magnet arrays includes a stack of magnets.

27. The hollow cathode magnetron sputter source of claim 1 wherein at least one of the first and second magnet arrays includes a magnet on top of a nonmagnetic pedestal.

28. The hollow cathode magnetron sputter source of claim 3 wherein the first magnet array is generally located on a first side of an axis of rotation of the magnet plate and the second magnet array is generally located on a second side of an axis of rotation of the magnet plate.

29. The hollow cathode magnetron sputter source of claim 3 wherein at least one of the first and second magnet arrays is in the form of a spiral with respect to an axis of rotation of the magnet plate.

30. A hollow cathode magnetron sputter source comprising:
    a cathode target having a sidewall portion and a closed end portion, the sidewall and closed end portions of the target forming a cavity;
    a main magnet positioned adjacent the sidewall portion of the target outside of the cavity, the main magnet producing a main magnetic field having field lines that extend into the cavity; and
    a magnet array positioned adjacent the closed end of the target outside of the cavity, the magnet array comprising a plurality of electromagnets, at least one of the magnets in the array producing a magnetic field which aids the main magnetic field, at least one other magnet in the array producing a magnetic field which bucks the main magnetic field.

31. A method of operating a hollow cathode magnetron sputter source, the sputter source comprising a cathode target having a sidewall portion and a closed end portion and forming a cavity, and a main magnet positioned adjacent the sidewall portion outside of the cavity and producing a main magnetic field that extends into the cavity, the method comprising:
    providing first and second magnet arrays adjacent the closed end portion of the target and outside of the cavity, a first magnetic field produced by the first magnet array aiding the main magnetic field, a second magnetic field produced by the second magnet array bucking the main magnet field;
    reducing the pressure in the sputter source;
    introducing an inert gas into the sputter source;
    applying a negative voltage to the target so as to create a plasma in the cavity; and
    rotating the magnet arrays.

32. The method of claim 31 wherein the target is symmetrical about an axis and rotating the magnet arrays comprises rotating the magnet arrays about the axis.

33. The method of claim 32 wherein a north pole of the first magnet array faces the closed end of the target and a south pole of the second magnet array faces the closed end of the target.

34. A method of operating a hollow cathode magnetron sputter source, the sputter source comprising a cathode target having a sidewall portion and a closed end portion and forming a cavity, and a main magnet positioned adjacent the sidewall portion outside of the cavity and producing a main magnetic field that extends into the cavity, the method comprising:

providing a plurality of electromagnets adjacent the closed end portion of the target and outside of the cavity;

reducing the pressure in the sputter source;

introducing an inert gas into the sputter source;

applying a negative voltage to the target so as to create a plasma in the cavity; and turning the electromagnets on and off in sequence to create first and second virtual rotating magnet arrays, the magnetic field produced by the first virtual rotating magnet array aiding the main magnetic field and the magnetic field produced by the second virtual rotating magnet array bucking the main magnetic field.

* * * * *